(12) United States Patent
Tajima et al.

(10) Patent No.: US 7,683,540 B2
(45) Date of Patent: Mar. 23, 2010

(54) LIGHT-EMITTING APPARATUS, METHOD OF MANUFACTURING LIGHT-EMITTING APPARATUS, IMAGE FORMING APPARATUS, AND ELECTRONIC APPARATUS

(75) Inventors: Takayuki Tajima, Shiojiri (JP); Hiroyuki Tatsugi, Chino (JP); Takanori Takeshita, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 766 days.

(21) Appl. No.: 11/468,452

(22) Filed: Aug. 30, 2006

(65) Prior Publication Data

US 2007/0069644 A1    Mar. 29, 2007

(30) Foreign Application Priority Data

Sep. 27, 2005  (JP) ............................. 2005-279248

(51) Int. Cl.
  *H01J 1/62*  (2006.01)
(52) U.S. Cl. ...................................... 313/512; 313/498
(58) Field of Classification Search ................ 313/512, 313/498, 506, 509
  See application file for complete search history.

(56) References Cited

FOREIGN PATENT DOCUMENTS

| JP | A-08-146441 | 6/1996 |
|---|---|---|
| JP | A-2001-210465 | 8/2001 |
| JP | A-2003-243160 | 8/2003 |
| JP | A-2003-243161 | 8/2003 |

*Primary Examiner*—Vip Patel
(74) *Attorney, Agent, or Firm*—Oliff & Berridge, PLC

(57) ABSTRACT

There is provided a light-emitting apparatus formed by attaching a device substrate where light-emitting device is formed and a sealing substrate which seals the device substrate through a sealing material and sealing the light-emitting device between the device substrate and the sealing substrate through the sealing material, wherein the sealing material includes a first sealing material and a second sealing material, wherein the first sealing material is formed to surround the light-emitting device between the device substrate and the sealing substrate and to have a sealing hole portion formed by not disposing the first sealing material, so that the first sealing material is discontinuous, wherein the sealing hole portion of the first sealing material is closed with the second sealing material, so that the second sealing material and the first sealing material constitute a ring-shaped sealing member, and wherein the first sealing material is provided with guide portions which are formed to be continuous with at least one side where the sealing hole portion is formed and to extend to an inner surface of the device substrate without being covered with the sealing substrate so as to be exposed.

8 Claims, 14 Drawing Sheets

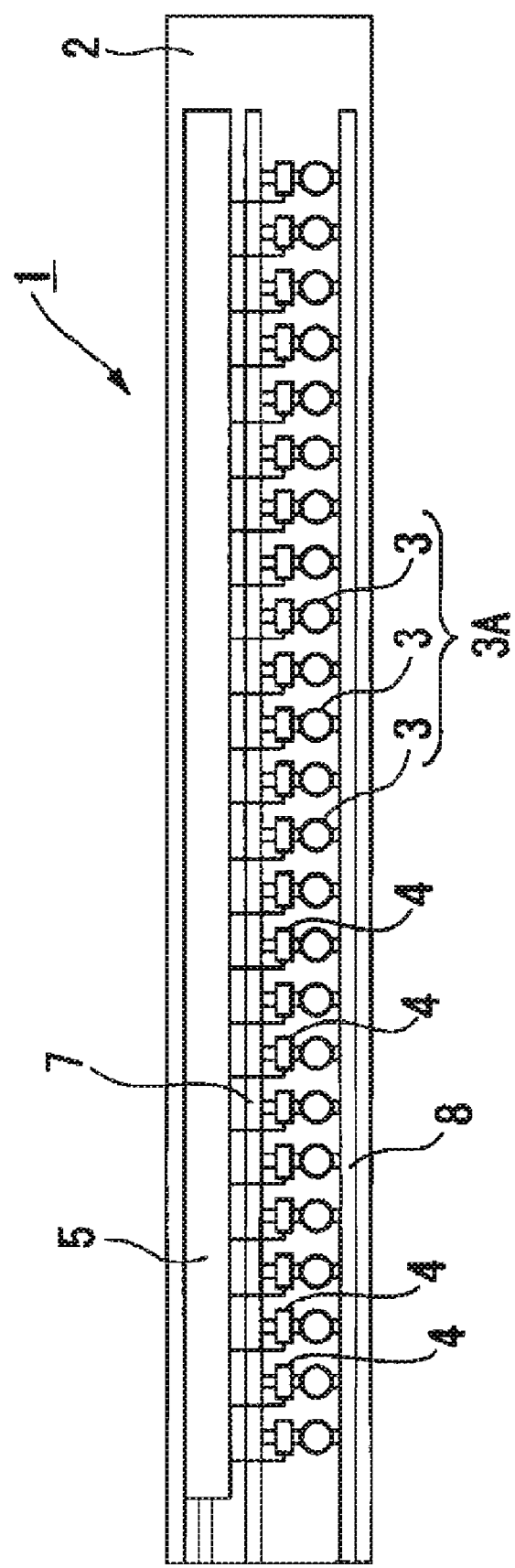

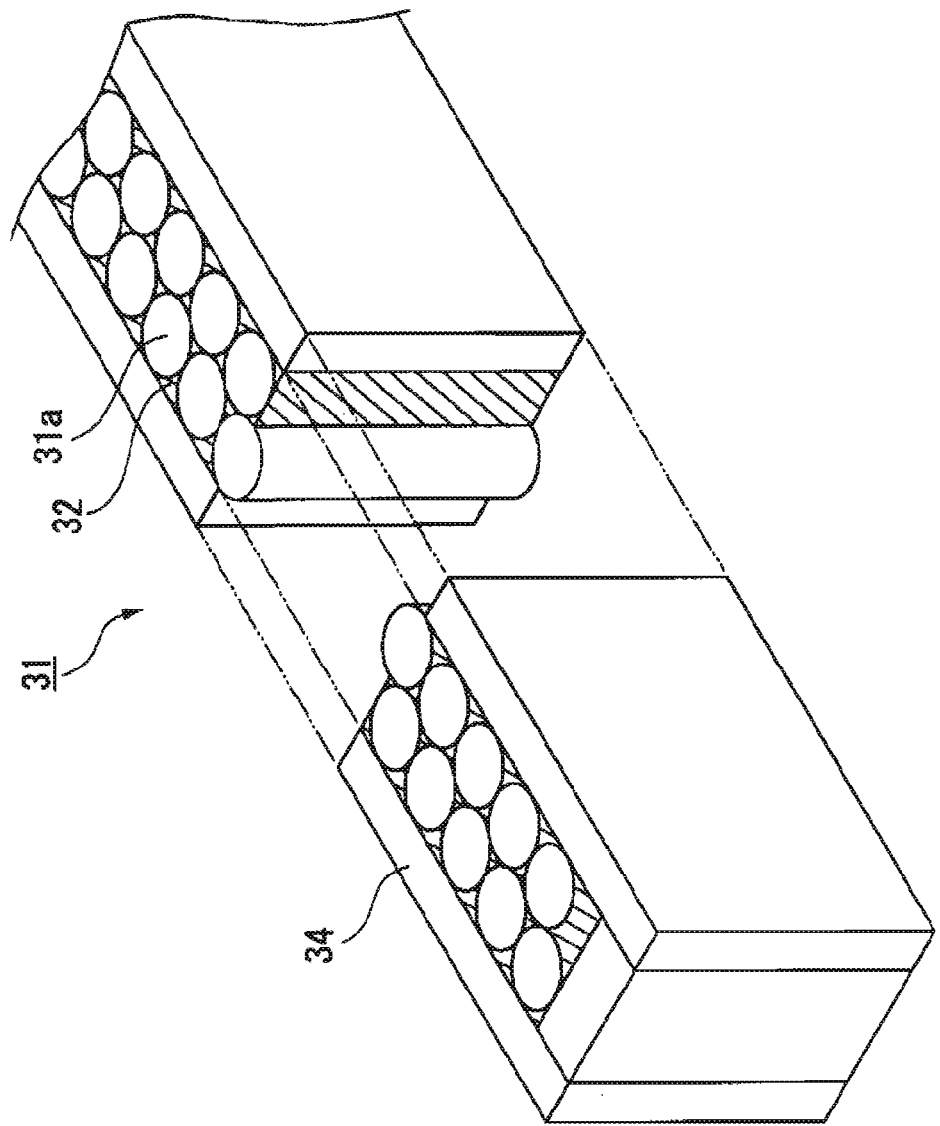

LIGHT-EMITTING APPARATUS, METHOD OF MANUFACTURING LIGHT-EMITTING APPARATUS, IMAGE FORMING APPARATUS, AND ELECTRONIC APPARATUS

The entire disclosure of Japanese Application No. 2005-279248, filed Sep. 27, 2005 is expressly incorporated by reference herein.

BACKGROUND

1. Technical Field

The present invention relates to a light-emitting apparatus, a method of manufacturing the light-emitting apparatus, an image forming apparatus, and an electronic apparatus.

2. Related Art

As a printer using electro-photography, a line printer (image forming apparatus) is known. The line printer includes a charger, a line-shaped printer head (exposing head), a developer, a transfer unit, or other devices which are disposed in the vicinity of a circumferential surface of a photosensitive drum, that is, a to-be-exposed object. A plurality of light-emitting devices provided to the printer head selectively emit light to perform exposure, so that an electrostatic latent image is formed on the circumferential surface of the photosensitive drum charged by the charger. The electrostatic latent image is developed by using a toner supplied from the developer, so that a toner image is transferred on a paper by the transfer unit.

In an example of the light-emitting device for such a printer head, tow columns of inorganic or organic light-emitting diodes (LEDs) are disposed in a shape of zigzag. however, in such a light-emitting device, there is a problem in that it is very difficult to accurately array thousands of light-emitting points. Recently, there has been proposed an image forming apparatus having a printer head using a light-emitting array of organic electro-luminescence devices (organic EL devices), that is, the light-emitting devices, so that the light-emitting points can be accurately arrayed.

Generally, in such as printer head (exposing head) using the organic EL devices, a device formation substrate where the organic EL devices (light-emitting devices) are formed and a sealing substrate are attached though a sealing material to seal the light-emitting devices, so that the light-emitting devices are protected from external atmosphere (oxygen and moisture). However, in general, in the state that the sealing material is coated along the entire periphery (whole circumference) of the substrate in a shape of ring, the device formation substrate is attached to the sealing substrate. In this case, since an inner portion surrounded by the sealing material becomes a closed space, a pressure (internal pressure) thereof is higher than external pressure, so that it is difficult to control a gap between the sealing substrate and the device formation substrate.

In order to solve the problem, sealing methods are disclosed in JP-A-2003-243160 and JP-A-2003-243161. According to the methods, a first sealing material and a second sealing material is formed to have discontinuous portions, and when the substrates are attached to each other, these sealing materials are formed to be continuous.

However, in the aforementioned methods, at the time of attaching the substrates, the first sealing material and the second sealing material may not be sufficiently continuous, so that effective sealing performance is not obtained. Therefore, there is a problem of deterioration in light-emitting characteristics of the organic EL devices.

In order to solve the problems, there may be considered a method where the first sealing material is formed to be discontinuous by not coating a portion of the first sealing material without continuity in a shape of ring, and after the attaching of the substrates, a separate second sealing material is coated in a regions where first sealing material is not coated, thereby sealing the light-emitting devices.

However, in the method, there is a problem in that the second sealing material may not be selectively coated only in a described region.

SUMMARY

An advantage of some aspects of the invention is to provide a light-emitting apparatus capable of providing a first sealing material formed to have a discontinuous portion, easily disposing a second sealing materials in the discontinuous portion, and effectively sealing a light-emitting device with the sealing materials, a method of manufacturing the light-emitting apparatus, an image forming apparatus, and electronic apparatus.

According to an aspect of the invention, there is provided a light-emitting apparatus formed by attaching a device substrate where light-emitting device is formed and a sealing substrate which seals the device substrate through a sealing material and sealing the light-emitting device between the device substrate and the sealing substrate through the sealing material, wherein the sealing material includes a first sealing material and a second sealing material, wherein the first sealing material is formed to surround the light-emitting device between the device substrate and the sealing substrate and to have a sealing hole portion formed by not disposing the first sealing material, so that the first sealing material is discontinuous, wherein the sealing hole portion of the first sealing material is closed with the second sealing material, so that the second sealing material and the first sealing material constitute a ring-shaped sealing member, and wherein the first sealing material is provided with guide portions which are formed to be continuous with at least one side where the sealing hole portion is formed and to extend to an inner surface of the device substrate without being covered with the sealing substrate so as to be exposed.

According to the light-emitting apparatus, since the guide portions are formed in the sealing hole portion, when the second sealing material is disposed in the sealing hole portion at a process of the manufacturing the light-emitting apparatus, even though a deposition position of the second sealing material is deviated, the second sealing material can be guided into the sealing hole portion by the guide portions, so that it is possible to easily and securely dispose the second sealing material in the sealing hole portion. Therefore, the sealing hole portion is securely closed by the second sealing material, so that it is possible to more effectively seal the light-emitting device.

In the light-emitting apparatus according to the aforementioned aspect, it is preferable that a pair of the guide portions are formed to be continuous with both sides of the sealing hole portion of the first sealing material.

According to such a construction, since a pair of guide portions are formed, the second sealing material is disposed between a pair of the guide portions at the time of manufacturing, the second sealing material can be more securely guided into the sealing hole portion without flowing into a region other than the sealing hole portion, and be sealing hole portion can be closed.

In addition, in the aforementioned light-emitting apparatuses, it is preferable that in a pair of the guide portions, an interval between the guide portions is small at a side of sealing hole portion and gradually enlarged as a position becomes more distant from the sealing hole portion. In the light-emitting apparatus, it is preferable that a pair of the guide portions have an opening angle ranging from 5° to 170°.

According to such a construction, at the time of manufacturing, the second sealing material can be more securely guide into the sealing hole portion, and the sealing hole portion can be closed. In addition, since the interval between the guide portions are enlarged as a position becomes more distant from the sealing hole portion, a margin at the time of disposing the second sealing material can be increased.

In addition, since the opening angle of a pair of the guide portions is in a range of from 5° to 170°, when the second sealing material is disposed between the guide portions, the sealing hole portion can be securely closed.

In addition, in the aforementioned light-emitting apparatuses, it is preferable that the first sealing material has a large width portion which is disposed in the vicinity of the sealing hole portion to be wider than other portions.

According to such a construction, since a large width portion is formed, at the time of manufacturing, the large width portion can prevent the second sealing material disposed in the sealing hole portion from being extracted through a gap between the first sealing material and the substrate and flowing out from the sealing hole portion.

In addition, in the aforementioned light-emitting apparatuses, it is preferable that a sealing material extension preventing portion is formed in an inner side of the sealing hole portion in the vicinity of the sealing portion in an inner surface of the device substrate in a shape of concave.

According to such a construction, since the sealing material extension preventing portion is formed, even though the second sealing material flows into an inner side of the sealing hole portion at the time of manufacturing, it is possible to prevent the second sealing material from flowing further into the inner portion by the sealing material extension preventing portion.

In addition, in the aforementioned light-emitting apparatuses, it is preferable that the sealing hole portion is disposed at side end portions of the device substrate and the sealing substrate.

According to such. a construction, positions of devices or wire lines on the device substrate is not so greatly limited by the position of the sealing hole portion, so that a degree of freedom for designing the devices and wire lines can be increased.

According to another aspect of; the invention, there is provided a method of manufacturing a light-emitting apparatus formed by attaching a device substrate where light-emitting device are formed and a sealing substrate which seals the device substrate through a sealing material and sealing the light-emitting device between the device substrate and the sealing substrate through the sealing material, the method comprising: disposing the first sealing material in an inner surface of the device substrate to surround the light-emitting device and forming a sealing hole portion so as for the first sealing material to be discontinuous by no disposing the first sealing material; mounting the sealing substrate on the device substrate through the first sealing material; and after the sealing substrate is mounted on the device substrate, disposing a second sealing member into the sealing hole portion of the first sealing material to close the sealing hole portion, thereby forming a ring-shaped sealing member with the first sealing material and the second sealing material, wherein in the disposing of the first sealing material, guide portions which are continuous with at least one side where the sealing hole portion is formed are formed to extend to an inner surface of the device substrate without being covered with the sealing substrate so as to be exposed.

According to the method of manufacturing the light-emitting apparatus, since the guide portions are formed in the sealing hole portion, when the second sealing material is disposed in the sealing hole portion at a process of the manufacturing the light-emitting apparatus, even though a deposition position of the second sealing material is deviated, the second sealing material can be guided into the sealing hole portion by the guide portions, so that it is possible to easily and securely dispose the second sealing material in the sealing hole portion. Therefore, the sealing hole portion is securely closed by the second sealing material, so that it is possible to more effectively seal the light-emitting device.

In the method of manufacturing the light-emitting apparatus according to the aforementioned aspect, it is preferable that a plurality of large-sized substrates are used as the device substrate and the sealing substrate, and the large-sized device substrate and the large-sized sealing substrate are attached to each other through the sealing member and, and after that, are subject to chipping, thereby obtaining unit substrates.

When the second sealing material is disposed in the sealing hole portion to close the second sealing material, if the second sealing material flows out from the sealing hole portion, and the second sealing material may be cured, for example, in the scribe line. In this case, when the large-sized substrates are chipped into unit devices, it is not easily to chip the large-sized sub rates into the unit substrates in a scribing process. However, according to the aforementioned construction, since the guide portions are formed, it is possible to prevent the second sealing portion from flowing out from the sealing hole portion. Therefore, It is possible to solve a problem in that it is not easily to chip the large-sized substrate into the unit substrates in the scribing process.

According to still another aspect of the invention, there is provided an image forming apparatus having the aforementioned light-emitting apparatuses or a light-emitting apparatus obtained by the aforementioned methods as an exposure unit.

According to the image forming apparatus, since the light-emitting apparatus where the light-emitting devices are effectively sealed are used as the exposure unit, it is possible to prevent deterioration of the exposure unit caused from the moisture or the like, so that it is possible to ensure long-time reliability of the image forming apparatus.

According to still another aspect of the invention, there is provided an electronic apparatus having the aforementioned light-emitting apparatuses or a light-emitting apparatus obtained by the aforementioned methods as a display unit.

According to the electronic apparatus, since the light-emitting apparatus where the light-emitting devices are effectively sealed are used as the display unit, it is possible to prevent deterioration of the display unit caused from the moisture or the like, so that it is possible to ensure long-time reliability of the electronic apparatus

BRIEF DESCRIPTION OF THE DRAWINGS

The invention will be described with reference to the accompanying drawings, wherein like numbers reference like elements.

FIG. 2 is a schematic view showing a line head.

FIG. 4 is a perspective view showing an SL array.

DESCRIPTION OF EXEMPLARY EMBODIMENTS

Hereinafter, embodiment of the invention will be described with reference to the accompanying drawings. In the following figures, sizes of components are suitably modified for the better understanding of the figure.

Line Head Module

Firstly, as a light-emitting apparatus according to an embodiment of the invention, a line head module having a line head (exposing head) is described.

Figure 1:
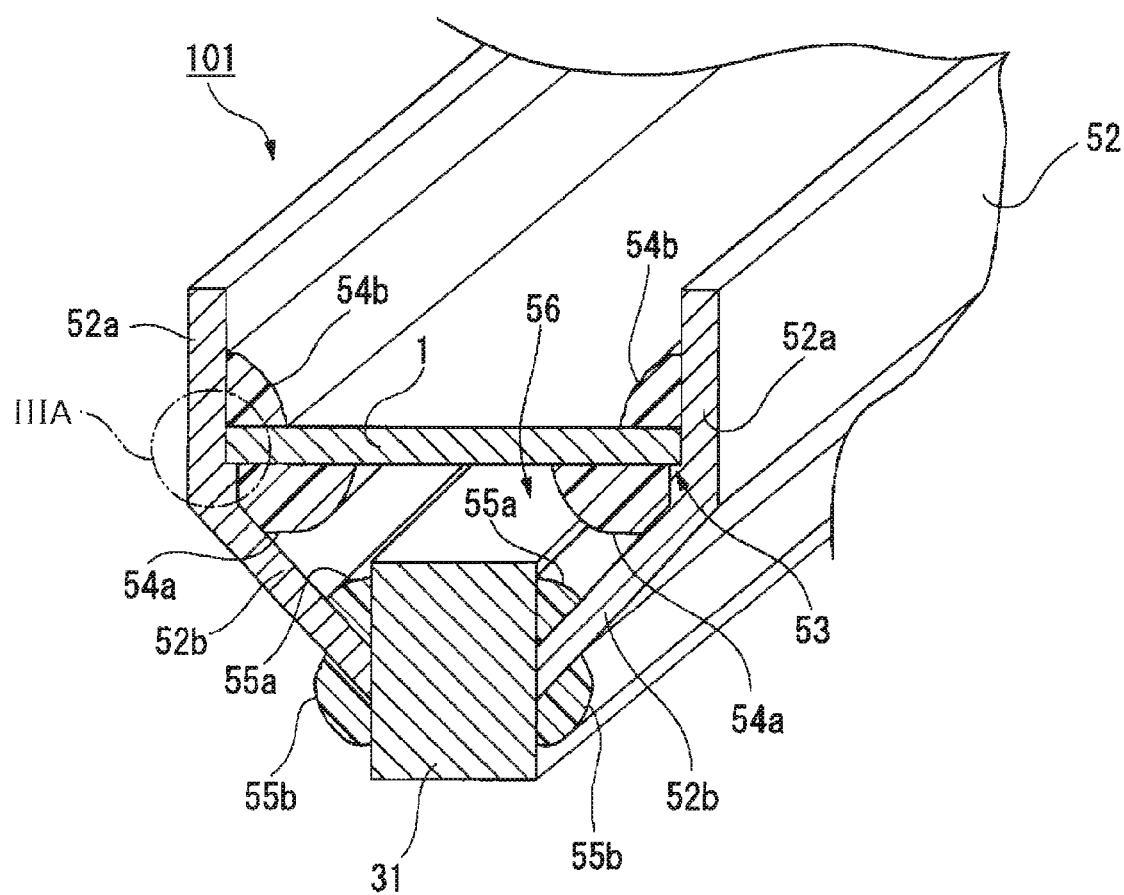
FIG. 1 is a perspective cross-sectional view showing a line head module according to the invention.

FIG. 1 is a perspective cross-sectional view showing the line head module according to the embodiment of the invention. The line head module 101 includes a line head 1 where a plurality of organic EL devices are aligned, an SL array (lens array) 31 where lens elements for forming an erect equally-sized image with light from the line head 1 with equal magnification, and a head case 52 which supports peripheries of the line head 1 and the SL array 31. The line head 1 and the SL array 31 are supported by the head case 52 in the state that the line head 1 and the SL array 31 are aligned with each other. In such a construction, the SL array 31 is arranged to form the erect equally-sized image on a later-described photosensitive drum with the light from the line head 1.

Line Head

FIG. 2 is a schematic view showing the line head. The line head 1 is employed as a light-emitting apparatus according to the embodiment of the invention. The line head 1 is constructed by integrating a light-emitting device column (light-emitting line) 3A which is formed by arraying a plurality of organic EL (Electro-Luminescence) devices 3 as light-emitting devices according to the invention, a driving device group including driving devices 4 for driving the organic EL devices 3, and a control circuit group which controls driving of the driving devices 4 (driving device group) into a thin long rectangular device substrate 2. Although the light-emitting device column 3A is formed with a single column of organic EL devices 3 in FIG. 2, the light-emitting device column 3A may be formed with two columns of organic EL devices 3 in a shape of zigzag. In this case, a pitch of the organic EL devices 3 in a longitudinal direction of the line head 1 can be reduced, so that a resolution of a later-described image forming apparatus can be improved.

Each of the organic EL devices 3 includes at least an organic light-emitting layer between a pair of electrodes. When the light-emitting layer is supplied with a current from a pair of the electrodes, each of the organic EL devices 3 emits light. The one electrode of the organic EL device 3 is connected to a power supply line 8, and the other electrode thereof is connected to a power supply line 7 through driving devices 4. The driving devices 4 are constructed with switching devices such as thin film transistors (TFTs) and thin film diodes (TFDs). In a case where the driving devices 4 are constructed with the TFTS, a source region is connected to the power supply line 8, and a gate electrode is connected to the control circuit group 5. Operations of the driving devices 4 are controlled by the control circuit group 5, and turn on and off of the organic EL devices 3 are controlled by the driving devices 4.

Constructions of the organic EL devices 3, the driving devices 4, and so on are described in detail with reference to FIGS. 3A and 3B.

Figure 3A:
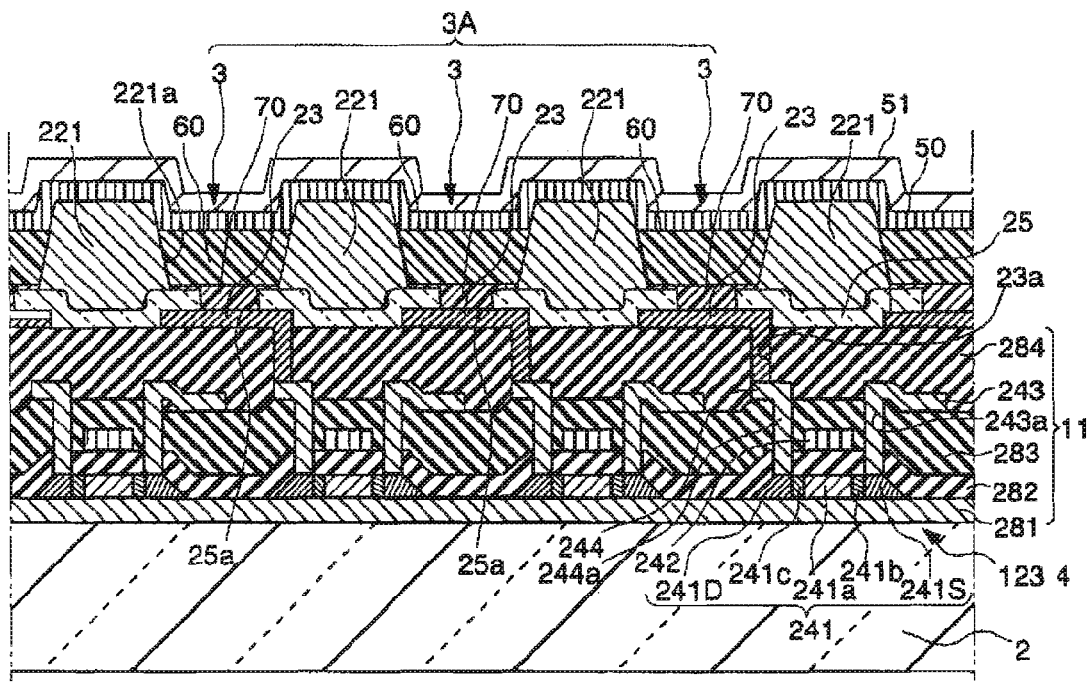
FIG. 3A is a cross-sectional view showing main components of a line head.

As shown in FIG. 3A, in case of a bottom emission type where light emitted from the light-emitting layer 60 is output from a side of pixel electrodes 23, the light is emitted through a side of the device substrate 2. Therefore, the device substrate 2 is made of a transplant or semi-transparent material. As an example of the material, there are glass, quartz, a resin (plastic or plastic film), and so on. Particularly, a glass substrate may be suitably used.

In addition, in case of a top emission type where the light emitted from the light-emitting layer 60 is output from a side of negative electrodes (opposite electrodes) 50, the light is emitted through a side of a sealing substrate opposite to the device substrate 2. Therefore, the sealing substrate 2 may be constructed with a transparent substrate or an opaque substrate. As an example of the opaque substrate, there is a substrate manufactured by performing an insulation process such as surface oxidation on ceramics such as alumina or a metal sheet of stainless steel or the like. In addition, a thermo-setting resin and a thermo-plastic resin may be used.

In the embodiment, the bottom emission type is employed, and a transparent glass is used for the device substrate 2.

A circuit section 11 including driving TFTs 123 (driving devices 4) or other device connected to the pixel electrodes 23 is formed on the device substrate 2, and the organic EL devices 3 are disposed thereon. Each of the organic EL devices 3 is constructed by sequentially stacking a pixel electrode 23 which functions as a positive electrode, a hole transport layer 70 which injects and transports holes from the pixel electrode 23, a light-emitting layer 60 which is made of an organic EL material, and a negative electrode 50 in this order.

Figure 3B:
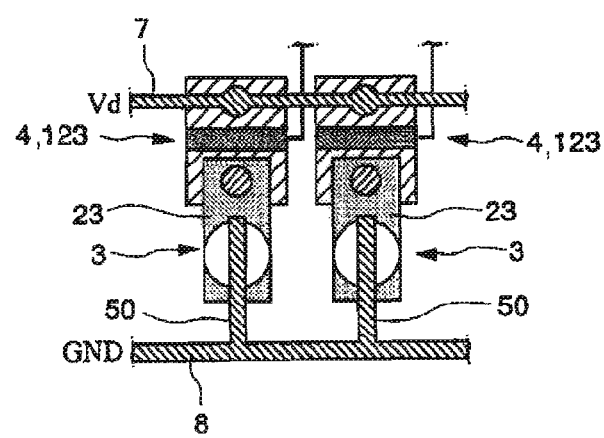
FIG. 3B is a schematic view thereof.

FIG. 3B is a schematic view of the organic EL devices 3 and the driving TFTs 123 (driving devices 4) corresponding to FIG. 2. In FIG. 3B, the power supply line 7 is connected to source and drain electrodes of the driving devices 4, and the power supply line 8 is connected to the negative electrode 50 of the organic EL devices 3.

In the organic EL devices 3 having such a construction, as shown in FIG. 3A, holes injected from the hole transport layer 70 and electrons injected from the negative electrode 50 are coupled with each other in the light-emitting layer 60, so that light can be emitted.

In the bottom emission type such as the embodiment, the pixel electrodes 23 are made of a transparent conductive material. More specifically ITO is suitably used.

As a suitable example of a material for forming the hole transport 70, there is a dispersing solution of 3,4-polyethylene dioxythiopen/polystyrene sulfonic acid (PEDOT/PSS), that is, a dispersing solution obtained by dispersing 3,4-polyethylene dioxythiopen in a dispersing medium of a polystyrene sulfonic acid and dispersing the resulting product in water.

The material for forming the hole transport layer 70 is not limited to the aforementioned materials, but various materials may be used. For example, there may be used a dispersing solution obtained by dispersing polystyrene, polypyrol, polyanyline, poly acetylene, or derivatives thereof in a suitable dispersing medium, for example, the aforementioned polystyrene sulfonic acid.

As a material for forming the light-emitting layer 60, there may be used a well-known light-emitting material which can emit light in fluorescence or phosphorescence. In the embodiment, although a light-emitting layer having a light-emitting wavelength band corresponding to red color is used, a light-emitting layer having a light-emitting wavelength band corresponding to green or blue color may be used. In this case, the photosensitive material having sensitivity in the light-emitting wavelength band is employed.

As a suitable example of a material of forming the light-emitting layer 60, there are polysilane-based material such as a (poly)fluorene derivative (PF), a (poly)paraphenyl vinylene derivative (PPV), a polyphenylene derivative (PP), a polyparaphenylene derivative (PPP), a polyvinylkarbazol (PVK), a polythiopen derivative, and a polymethylphenyl silane (PMPS). In addition, a material obtained by doping a large molecule material such a perylene-based colorant, a coumalin-based colorant, and a rhodamine-based colorant or a small molecule material such as rubrene, pherylene, 9,10-diphenyl anthracene, tetra phenyl butadiene, nile red, coumalin 6, and quinacridone in the aforementioned polymer material.

The negative electrode 50 is formed so as to cover the light-emitting layer 60. For example, the negative electrode is an electrode having a stacked structure of a Ca layer with a thickness of 20 nm and an Al layer with a thickness of 200 m staked thereon and using the Al layer as a reflecting layer.

As described later, a sealing substrate (not shown) is attached on the negative electrode 50 through a sealing layer (adhesive layer) including first and second sealing materials which are disposed to surround the negative electrode 50. The sealing layer including the first and second sealing materials are characteristic portions of the invention and described later in detail.

As described above, the circuit section 11 is disposed under the organic EL devices 3. The circuit section 11 is formed on the device substrate 2. More specifically, an underlying protective layer 281 mainly made of $SiO_2$ is formed as a base on a surface of the device substrate 2, and a silicon layer 241 is formed thereon. A gate insulating layer 282 mainly made of $SiO_2$ and SiN is formed on a surface of the silicon 241.

A region of the silicon layer 241 which overlap a gate electrode 242 with a gate insulating layer 282 interposed becomes a channel region 241a. The gate electrode 242 is a portion of a scan line (not shown), A first interlayer insulating layer 283 mainly made of $SiO_2$ is formed on the gate insulating layer 282 which covers the silicon layer 241 and on which the gate electrode 242 is formed.

Tn the silicon layer 241, a source side of the channel region 241a is provided with a lightly-doped source region 241b and a heavily-dope source region 241S, and a drain side of the channel region 241a is provided with a lightly-doped drain region 241c and a heavily-dope drain region 241D, so that the so-called LDD (Lightly Doped Drain) structure is formed.

The heavily-dope source region 241S is connected to the source electrode 243 through a contact hole 243A which passes through the gate insulating layer 282 and the first interlayer insulating layer 283. The source electrode 243 is formed as a portion of a power supply line (not shown). The heavily-dope drain region 241D is connected to the drain electrode 244 which is formed on the same layer as the source electrode 243 through a contact hole 244a which passes through the gate insulating layer 282 the first interlayer insulating layer 283.

A planarized layer 284 mainly made of, for example, an acrylic resin is formed on an upper layer of the first interlayer insulating layer 283 where the source electrode 243 and the drain electrode 244 are formed. The planarized layer 284 is made of a heat-resistance insulating resin such as an acrylic resin and a polyimide resin and used to remove unevenness of surfaces of the driving TFTs 123 (driving devices 4), the source electrodes 243, the drain electrodes 244, or the like as well-known in the related art.

The pixel electrodes 23 made of ITO and the like are formed on a surface of the planarized layer 284 and connected to the drain electrodes 244 through contact holes 23A which is formed in the planarized layer 284. The pixel electrodes 23 are connected to the heavily-dope drain region 241D of the silicon layer 241 through the drain electrode 244.

The pixel electrodes 23 and the aforementioned inorganic partition walls 5 are formed on the planarized layer 284 where the pixel electrodes 23 are formed, and organic partition walls 221 are formed on the inorganic partition wall 25. On each of the pixel electrode 23, the hole transport layer 70 and the light-emitting layer 60 are stacked in this order from a side of pixel electrodes 23 in a pixel region, that is, a region defined by the opening 25a formed in the inorganic partition wall 25 and an opening 221a formed in the organic partition wall 221.

SL Array

FIG. 4 is a perspective view of an SL array. The SL array 31 is constructed by aligning (disposing) two columns of SL elements 31a in a shape of zigzag. As an example of SL element 31a, there is SELFOC (registered trade mark) lens element of Nippon Sheet Glass Co., Ltd. Void spaces between the SL elements 31a disposed in a shape of zigzag are filled with a black silicon resin 32, and a frame 34 is disposed to surround the SL elements.

The SL element 31a has a parabolic distribution of refractive index which varies parabolically from a center to peripheries. Therefore, light incident on the SL element 31a propagate an inner portion thereof in a shape of meander. According, by adjusting lengths of the SL elements 31a, an erect equally-sized image can be formed. According to such SL elements 31a capable of forming the erect equally-sized image, images formed by adjacent SL elements 31a can overlapped with each other, so that a wide image can be obtained. The SL array 31 shown in FIG. 4 can form an image at a high accuracy by using light from the whole line head 1.

Head Case

Returning to FIG, 1, the line head module 101 according to the embodiment includes a head case 52 which supports peripheral portions of the line head 1 and the lens array 31. The head case 52 is made of a high-strength material such as AL in a shape of slit. in a cross section of the head case 52 in a direction perpendicular to a longitudinal direction thereof, upper and lower ends thereof are opened, upper side walls 52a and 52a are disposed to be parallel to each other, lower side walls 52b and 52b are disposed to be slanted toward a lower central portion. Although not shown, side walls of the head case 52 at both ends in the longitudinal direction thereof are disposed to be parallel to each other.

The aforementioned line head 1 is disposed in an inner portion defined by the upper side walls 52a of the head case 52.

Figure 5:
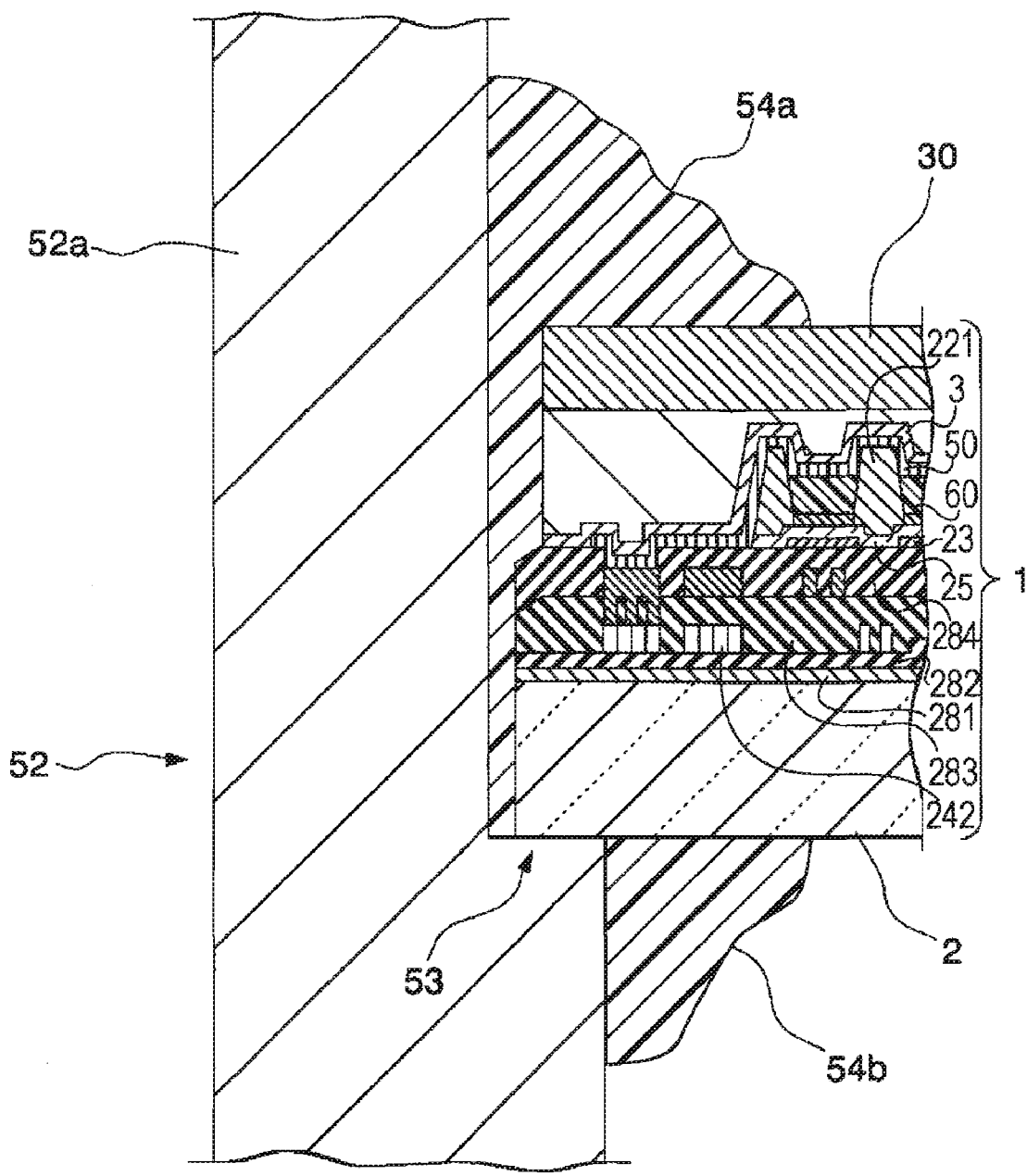
FIG. 5 is an enlarged view showing an assembled portion of a line head.

FIG. 5 is an enlarged view of an assembled portion (a portion A of FIG. 1) of the line head. As shown In FIG. 5, a plate 53 having a shape of step along a whole circumference is formed in the inner portion defined by the side walls 52a of the head case 52. A bottom surface of the line head 1 is in contact with a top surface of the plate 53, and the line head 1 is disposed horizontally. As described later, the line head 1 is of a bottom emission type where the device substrate 2 is directed downward, and the sealing substrate 30 is directed upward.

Corner portions formed by the side walls 52a of the head case 52 and the line head 1 are provided with sealing materials 54a and 54b along a whole circumference of the line head. In addition, gaps between inner surfaces of the side walls 52a of the head case 52 and side surfaces of the line head 1 are provided with a sealing material. Accordingly, the line head 1 is hermetically attached to the head case 52. The sealing material 54b provided to an upper portion of the line head 1 is made of a UV-curing resin as acryl. The sealing material 54a provided to a lower portion of the line head 1 is made of a thermo-setting resin such as epoxy.

The sealing materials 54a and 54b may contain a getter material. The getter material is a drying agent or a deoxidant for adsorbing moisture or oxygen. According to such a construction, penetration of the moisture or oxygen can be securely prevented by the sealing materials 54a and 54b. Therefore, moisture absorbing or oxidation of the organic EL devices disposed in the line head can be suppressed, so that it is possible to prevent deterioration in durability of the organic EL devices and shortening in life cycle thereof.

Returning to FIG. 1, the lens array 31 is disposed in the slit-shaped openings formed on a lower end portion of the head case 52. Corner portions formed by the side walls 52b of the head case 52 and the lens array 31 are provided with sealing materials 55a and 55b along a whole circumference of the lens array. In addition, gaps between inner surfaces of the side walls 52b of the head case 52 and side surfaces of the lens array 31 are provided with a sealing material. Accordingly, the lens array 31 is hermetically attached to the head case 52. The sealing material 55a provided to an upper portion of the lens array 31 is made of a thermo-setting resin such as epoxy. The sealing material 55b provided to a lower portion of the lens array 31 is made of a UV-curing resin such as acryl. The sealing materials 55a and 55b may contain a getter material.

In an inner portion of the head case 52, a chamber 56 is defined between the line head 1 and the lens array 31. As described above, since the line head 1 and the lens array 31 are hermetically attached to the head case 52, the chamber 56 is hermetically sealed. An inner space of the chamber 56 is filled with an inert gas such as nitrogen gas or maintained in vacuum.

Method of Manufacturing Line Head

Next, a method of manufacturing the line head 1 according to an embodiment of the invention is described.

Here, the organic EL devices (light-emitting devices) 3, the driving devices 4, or the like are prepared on the device substrate 2 by using well-known processes, and the sealing substrate 30 is attached thereto by using a sealing material. Now, a process for sealing the organic EL devices 3 or the like between the device substrate 2 and the sealing substrate 30 by using the sealing material is described.

The device substrate 2 and the sealing substrate 30 according to the embodiment are obtained by using a plurality of large-sized substrates, attaching a large-sized device substrate and a large-sized sealing substrate through the sealing material, and chipping the resulting product into unit substrates by a scriber.

Figure 6A:
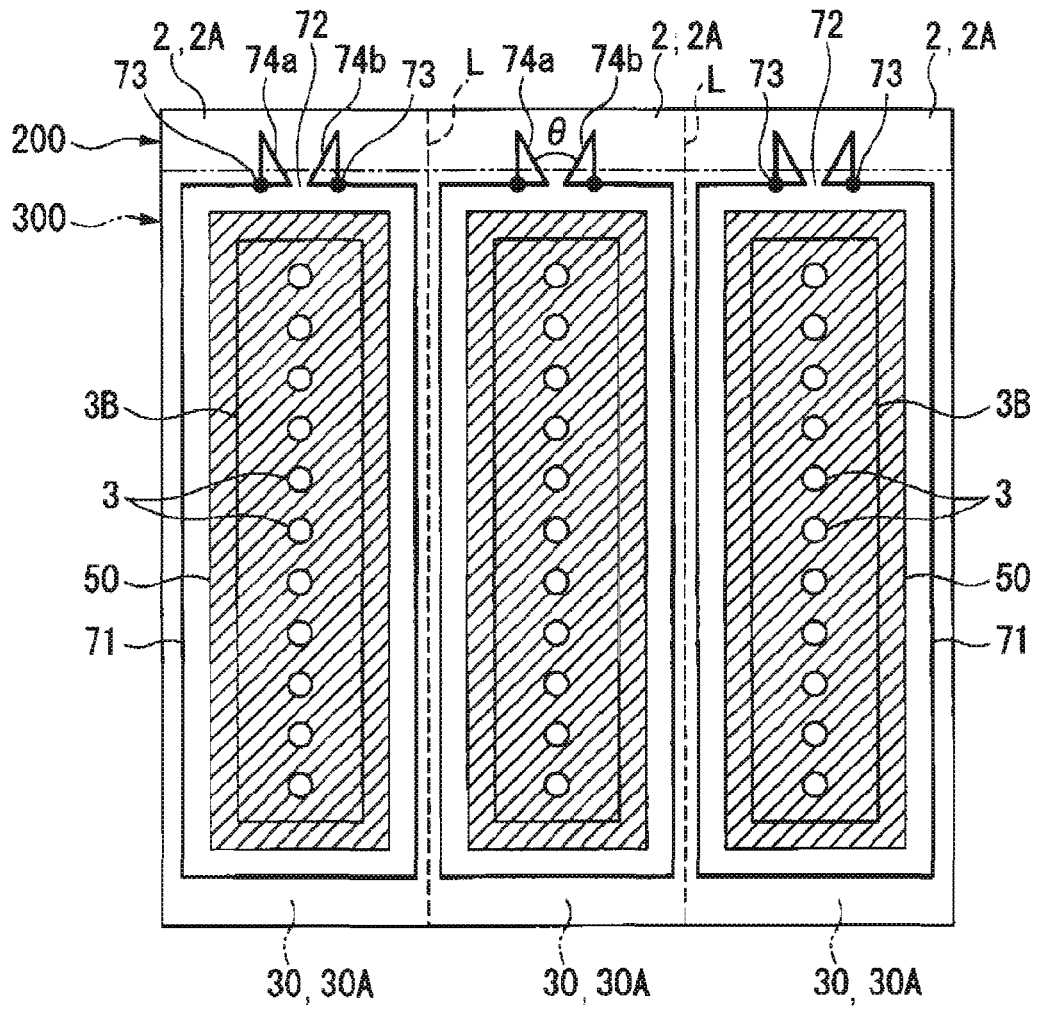
FIGS. 6A and 6B are views for explaining a manufacturing method according to an embodiment of the invention.

Firstly, as shown in FIG. 6A, a large-sized device substrate 200 constructed by forming light-emitting region 3B including the organic EL devices 3 in an inner portion of a region for forming negative electrode 50 is prepared. In FIG. 6A, dotted lines L denote scribe lines. The scribe lines L are drawn to be continuous at short sides of the device substrates 3 and to extend in longitudinal directions of long side thereof, so that three rectangular device substrates 2 can be obtained by chipping the large-sized device substrate 200. Alternatively, four or more device substrates 2 may be obtained from the large-sized device substrate 200.

A large-sized sealing substrate 300 is attached to the large-sized device substrate 200. As shown with a two-dotted dashed line in FIG. 6A, the large-sized sealing substrate 300 is disposed to expose a portion (device substrate region 2A) of the short side of each device substrate 2 without covering thereof and to cover the remaining region.

Figure 6B:
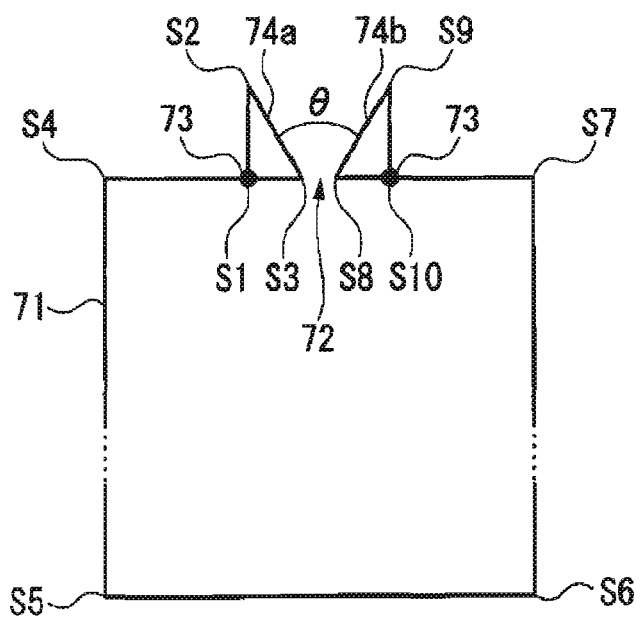

After the large-sized device substrate 200 and the large-sized sealing substrate 300 are prepared, in each device substrate region 2A of the large-sized device substrate 200, a first sealing material 71 is coated substantially in a shape of ring to surround the negative electrode 50 along an outer side thereof by using, for example, a dispense method or an inkjet method. At this time, it is preferable that the ejecting and coating of the first sealing material 71 is sequentially performed at one time without stop in an order of from position Si toward positions S2, S3, . . . , S10 shown in FIG. 6B, that is, an schematic enlarge view of main components in FIG. 6A. In first sealing material 71, a rectangular frame having positions S4, S5, S6, and S7 as corner portions are mainly attached to the large-sized sealing substrate 300.

In the disposed first sealing material 71, a sealing hole portion 72 is constructed by not disposing the first sealing material 71 to disconnect the first sealing material. More specifically, a disconnection portion between the positions S3 and S8 to disconnect the first sealing material 71, that is, a uncoated region becomes the sealing hole portion 72. The sealing substrate is attached over the sealing hole portion 72 as described later, so that a sealing hole is defined.

As described above, when the first sealing material 71 is sequentially coated (ejected) the first sealing material is coated (ejected) at the position S1 two times, that is, at the ejection staring time and at the time of directing from the position S3 to the position S4, so that a width of the first sealing material 71, that is, a line width (seal width) at the position S1 is larger than those of other positions. Similarly, the first sealing material is coated (ejected) at the position S10 two times, that is, at the ejection ending time and at the time of directing from the position S7 to the position S8, so that the width of the first sealing material 71 at the position S10 is larger than those of other positions. Therefore, the positions S1 and S10, that is, the ejecting starting and ending positions are set to be in the vicinity of the sealing hole portion 72, that is, in the vicinity of the positions S3 and S8 where the sealing hole portion 72 are formed, so that the large line width portion becomes large width portions 73 according to the invention.

In addition, portions which extend from the positions S3 and S8 forming the sealing hole portion 72 toward the outer side of the light-emitting region 3B, that is, portions extending from the position S3 and S8 to the positions S2 and S9 are not attached to the large-sized sealing substrate 300 to form guide portions 74a and 74b according to the invention, respectively. The guide portions 74a and 74b, particularly, portions thereof not attached to the large-sized sealing substrate 300 are exposed on the device substrate 2 (device substrate region 2A) so as to prevent the later-described second sealing material from flowing into a regions other than the sealing hole portion 72 and to guide the second sealing material into the sealing hole portion 72. It can be understood that portions of the guide portions 74a and 74b attached to the large-sized sealing substrate 300 also have a function of the guiding the second sealing material into the sealing hole portion 72.

With respect to an interval between the guide portions 74a and 74b, the interval at a side of the sealing hole portion 72 is small, and the interval is gradually enlarged as a position becomes more distant from the sealing hole portion 72, so that a substantially V-shaped region is formed as seen in a plan view. An opening angle θ between the guide portions 74a and 74b is preferably in a range of from 5° to 170°. In an angle of less than 5°, the interval between the guide portions 74a and 74b is two small, it is not easy to dispose the later-described second sealing member between the guide portions 74a and 74b. In an angel of more than 170°, when the second sealing material is disposed, the second sealing material may override front end sides of the guide portions 74a and 74b to flow into regions other than the sealing hole portion 72. In addition, by setting the opening angle in a range of from 5° to 170°, a margin at the time of disposing the second sealing material can be increased. In addition, by disposing the second sealing material between the guide portions 74a and 74b, it is possible to securely close the sealing hole portion 72.

After the first sealing material 71 is formed substantially in a shape of ring (rectangle) and the sealing hole portion 72, the large width portion 73, and the guide portions 74a and 74b are formed, the large-sized sealing substrate 300 is mounted on the large-sized device substrate 200 as shown in a two-dotted dashed line of FIG. 6A, and if needed, a pressure is exerted. As a result, a top portion of the sealing hole portion 72 is covered with large-sized sealing substrate 300, so that the sealing hole for opening the first sealing material can be obtained.

The large-sized sealing substrate 300 is subject to a preparation process such as cleaning or the like in advance, and if needed, an inner surface thereof is attached with a drying agent or the like. After the large-sized sealing substrate 300 is mounted on the large-sized device substrate 200, the first sealing material 71 is subject to a pre-curing process, if needed.

The second sealing material 75 is disposed in the sealing hole portion 72 of the first sealing material 71, that is, a portion defined as a sealing hole by covering of the large-sized sealing substrate 300. Since the sealing hole portion 72 is covered with the large-sized sealing substrate 300, it is not easy to directly fill the second sealing material 75 in the sealing hole portion 72, that is, in an inner portion of the sealing hole. Therefore, the guide portions 74a and 74b exposed on the large-sized device substrate 200 without covering the large-sized sealing substrate 300 is used, so that the second sealing material 75 is disposed in the sealing hole portion 72.

Figure 7:
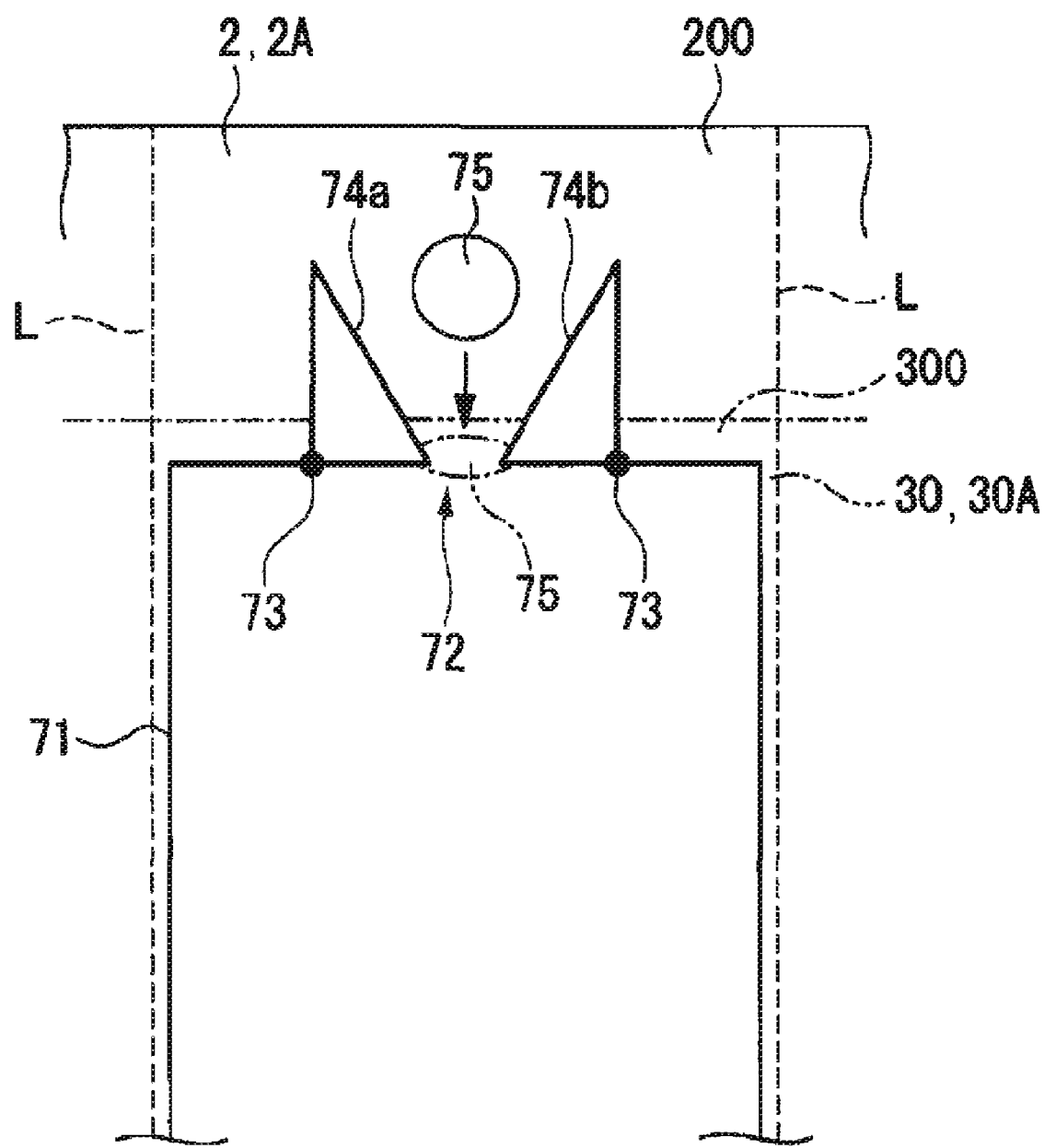
FIG. 7 is a schematic enlarged view showing main components for explaining a manufacturing method according to the invention.

More specifically, the large-sized device substrate 200 is slanted with suitable angel, so that the front ends of the guide portions 74a and 74b are directed upwardly, and the sealing hole portion 72 is directed downwardly. In this state, as shown in FIG. 7, the second sealing material 75 is elected and disposed between guide portions 74a and 74b exposed on the large-sized device substrate 200. Sine the interval between the front ends of the guide portions 74a and 74b is large, the second sealing material 75 can be securely disposed between the guide portions 74a and 74b even in a case where the ejecting position is slight deviated. Therefore, the margin at the time of disposing the second sealing material 75 can be increased.

Since the large-sized device substrate 200 is slanted, the second sealing material 75 disposed between the guide portions 74a and 74b flows toward the sealing hole portion 72. Since the guide portions 74a and 74b are provided at the lateral sides, even in a case where a portion of the second sealing material 75 flows not in the direction toward the sealing hole portion 72 but in the lateral direction, the second sealing material 75 can be guided into the sealing hole portion 72 by the guide portions 74a and 74b. Since the second sealing material 75 accurately flows into the sealing hole portion 72, the sealing hole portions 72 can be closed as shown in a two-dotted dashed line of FIG. 7. In addition, due to the guide portions 74a and 74b, it is possible to securely prevent the second sealing material 75 from flowing in the lateral direction to reach the scribed line L.

In addition, since large width portions 73 are formed in the vicinity of the sealing hole portion 72, it is possible to prevent the second sealing material 75 disposed in the sealing hole portion 72 from being extracted through the gap of the first sealing material 71 and the large-sized sealing substrate 300 due to a capillary phenomenon and flowing out from the sealing hole portion 72 to reach the scribe line L.

After the second sealing material 75 is disposed and the sealing hole portion 72 is closed, the first sealing material 71 and the second sealing material 75 are subject to a main curing process. The curing process may be selected according to a type of the first and second sealing materials. In a case where the sealing materials are thermo-setting materials, a heating process is used as a curing process. In a case where the sealing materials are curing materials, a UV illuminating process is used as a curing process. Alternatively, a combination of the heating and UV illumination processes may be used.

By curing the first sealing material 71 and the second sealing material 75, a ring-shaped sealing member is constructed with the first sealing material 71 and the second sealing material 75, and the large-sized device substrate 200 and the large-sized sealing substrate 300 can be attached to each other through the sealing member. Accordingly, it is possible to effectively seal the organic EL devices (light-emitting devices 2) 3 formed on the device substrate regions 2A of the large-sized device substrate 200.

Next, a scribing process is performed along the scribe line L, so that the large-sized device substrate 200 and the large-sized sealing substrate 300 are chipped into unit substrates, that is, the device substrate 2. As a result, the line head 1 is obtained.

In the method of manufacturing the line head 1, even though the disposition positions of the second sealing materials 75 are deviated in a disposition process of the second sealing material 75 into the sealing hole portions 72, since the guide portions are formed in the sealing hole portions 72 constructed by using the first sealing material 71, the second sealing materials 75 is guided into the sealing hole portion 72 by the guide portions 74a and 74b. Therefore, it is possible to easily and securely the second sealing materials 75 into the sealing hole portions 72. Accordingly, the sealing hole portions 72 can be securely closed by the second sealing materials 75, so that it is possible to more effectively seal the organic EL devices (light-emitting devices) 3.

In addition, in the method of manufacturing the line head 1, since the guide portions 74a and 74b are formed, it is possible to preventing the second sealing materials 75 from flowing out from the sealing hole portions 72 by the guide portions 74a and 74b. Therefore, it is possible to solve a problem in that it is not easily to chip the large-sized substrate into the unit substrates in a scribing process.

Now, a light-emitting apparatus according to another embodiment of the invention and a method of manufacturing the same are described with reference to FIG. 8.

Figure 8:
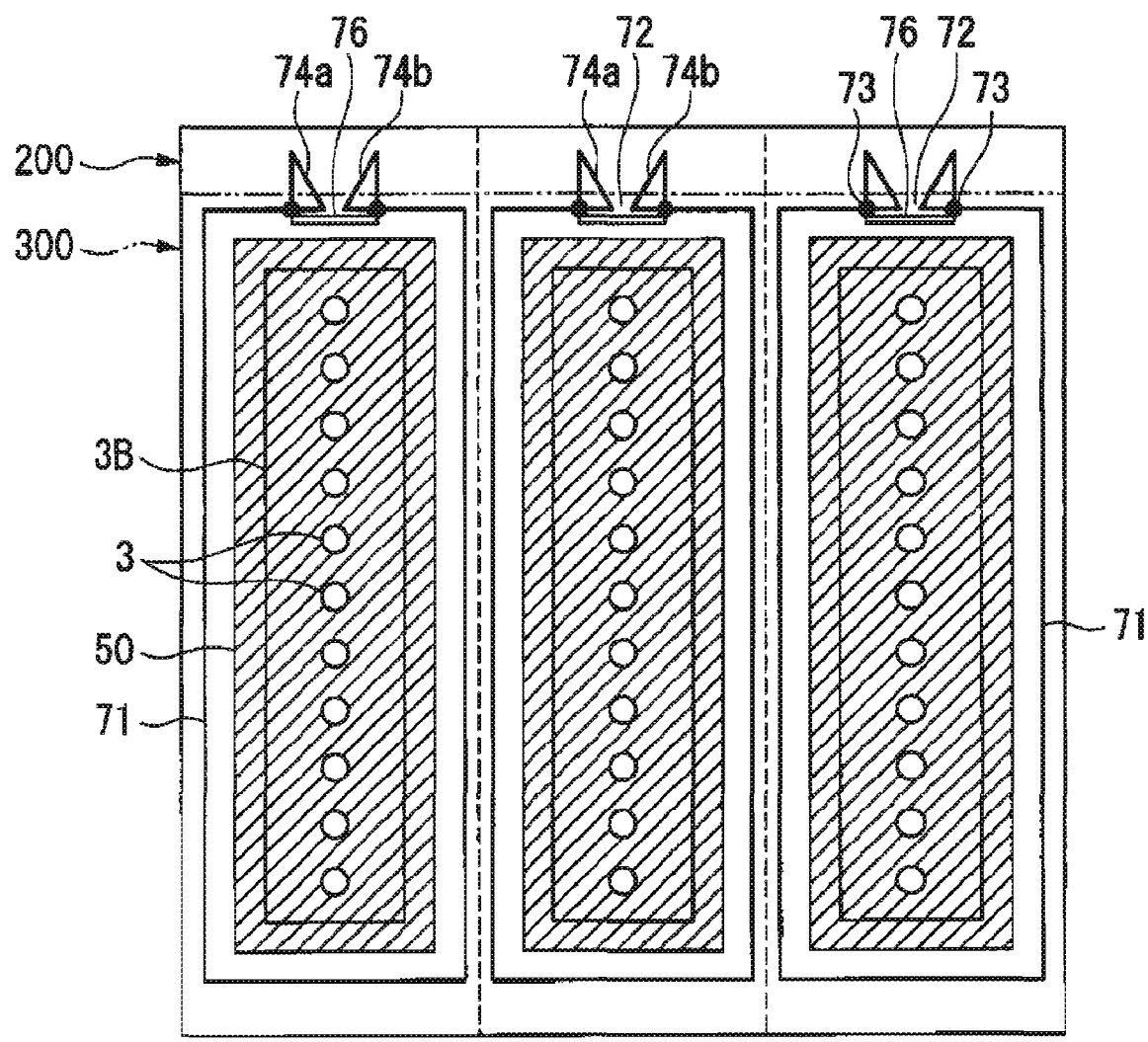
FIG. 8 is a view for explaining a manufacturing method according to another embodiment of the invention.

A difference between the embodiment shown in FIG. 8 and the aforementioned embodiment shown in FIGS. 6 and 7 is that a sealing material extension preventing portion 76 is disposed in an inner portion of the sealing hole portion 72 in the vicinity of the sealing hole portion 72 in an inner surface of the large-sized device substrate 201 in a shape of convex toward the surface of the substrate. The sealing material extension preventing portion 76 may be formed with the same material as those of wire lines and the organic partition walls 221 for partitioning the organic EL devices 3 on the same layer in the same process. In addition, the sealing material extension preventing portion 76 is formed in the inner side of the sealing hole portion 72 to have a length sufficiently larger than a diameter of the sealing hole portion 72.

Due to the sealing material extension preventing portion 76, even though the second sealing material (not shown) which is guided by the guide portions 74a and 74b and disposed to the sealing hole portion 72 flows to the inner portion of the sealing hole portion 72 in a process of manufacturing the light-emitting apparatus (line sensor 1), it is possible to prevent the second sealing material from flowing further into the inner portion by the sealing material extension preventing portion 76. Therefore, the second sealing material is stopped at the sealing hole portion 72, so that the sealing hole portion 72 can be securely closed.

Figure 9:
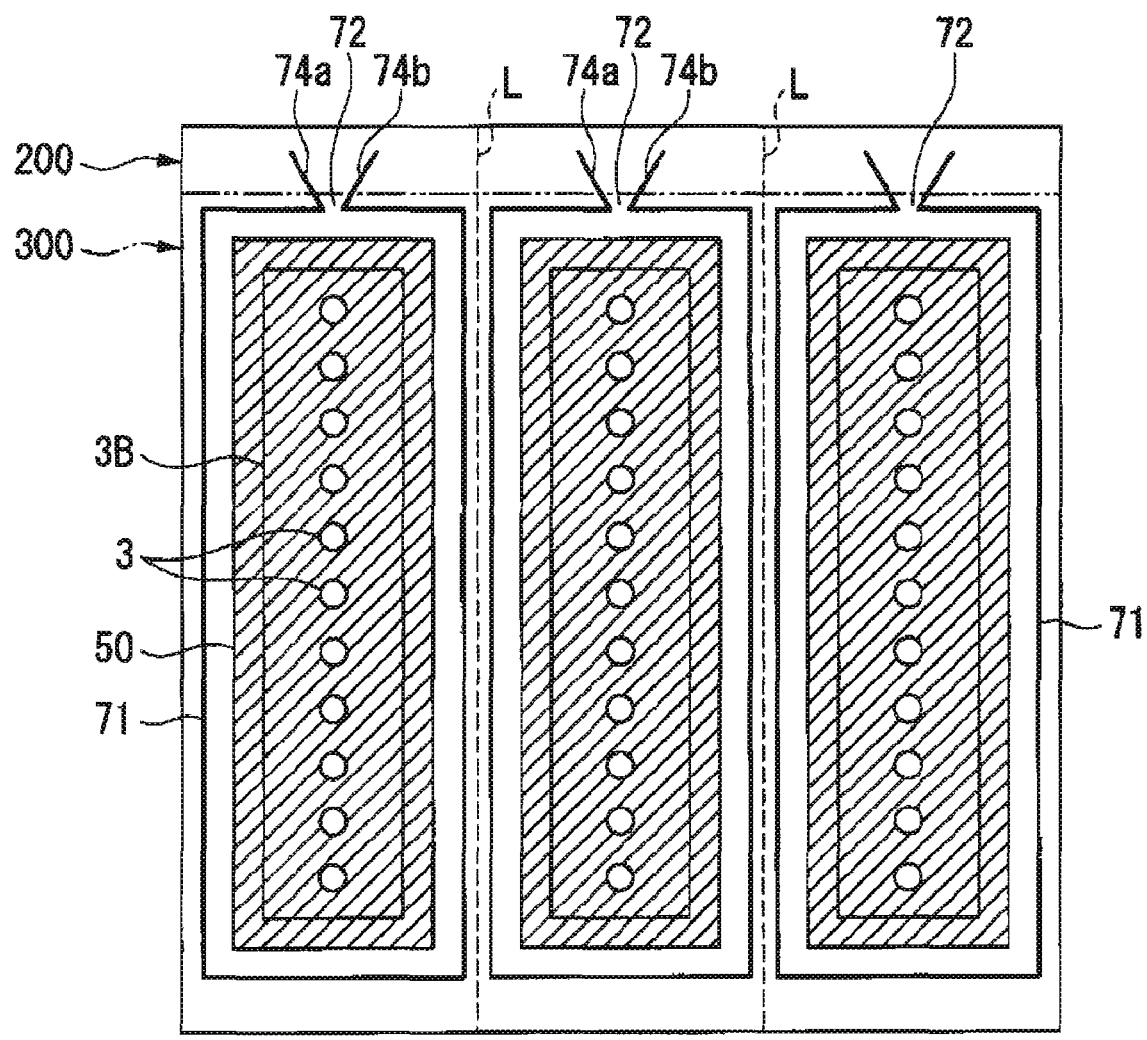
FIG. 9 is a view for explaining a manufacturing method according to another embodiment of the invention.

The invention is not limited to the aforementioned embodiment, but various modifications may be available without departing from a spirit and scope of the invention. For example, when the first sealing material 71 is disposed, the large width portion 73 may not provided, and both side of the sealing hole portion 72 are arranged to be continuous with each other to form the guide portions 74a and 74b as shown in FIG. 9. Alternatively, the both sides of the sealing hole portion 72 are arranged not be continuous with each other, but only one side thereof may be arranged to be continuous to form the guide portions. In this case, when the second sealing material 75 is disposed, the device substrates 2 (large-sized device substrate 200) are slanted to allow the second sealing material 75 to flow into the sides of the guide portions, so that it is possible to easily and securely dispose the second sealing material 75 into the sealing hole portion 72.

Figure 10:
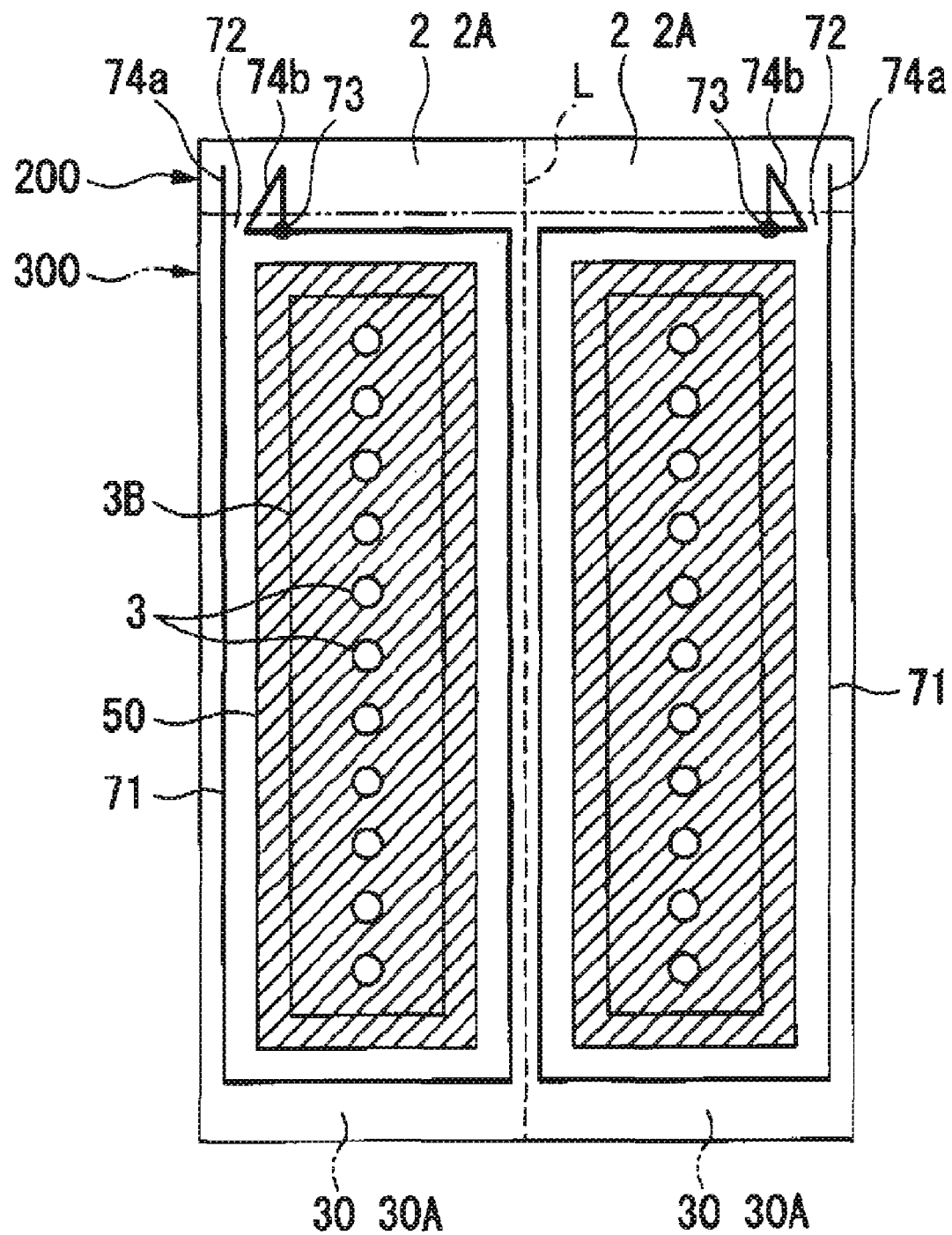
FIG. 10 is a view for explaining a manufacturing method according to another embodiment of the invention.

In addition, as shown in FIG. 10, the sealing hole portion 72 formed by the first sealing material 71 may be formed at side end portions of the device substrate 2 and the sealing substrate 30. When the sealing hole portion 72 are disposed at an end portion of one short side of the device substrate 2 except the central portion of the short side of the device substrate 2, positions of devices or wire lines on the device substrate 2 is not so greatly limited by the position of the sealing hole portion 72, so that a degree of freedom for designing the devices and wire lines can be increased.

In addition, as shown in FIG. 10, two large-sized device substrates 200 may be used, and the sealing hole portion 72 may be disposed at a side opposite to the scribe line L in each of device substrates 2 (device substrate region 2A). Therefore, although the second sealing material 75 overrides or turns around the guide portions 74b to flow toward the scribe line L, since the distance from the sealing hole portion 72 to the scribe line L is large, it is possible to prevent the second sealing material 75 from reaching the scribe line L. Accordingly, it is possible to solve a problem in that it is not easily to chip the large-sized substrate into the unit substrates by a scribing process.

In addition, the method according to the embodiment of the invention is employed in a case where the large-sized device substrate 200 and the large-sized sealing substrate 300 are attached to each other through the sealing material and chipping into the unit devices is performed by a scriber, but the present invention is not limited thereto. For example, the method according to the embodiment of the invention is employed in a case where the unit substrates, that is, the device substrates 2 and the sealing substrate 30 are attached to each other. In addition, in a case where the unit substrate is used, the remaining peripheral portion may be needed to be removed by the scriber. In this case, the invention is also effectively used.

Now, a usage of the line head module 101 including the line head 1 is described.

Figure 11:
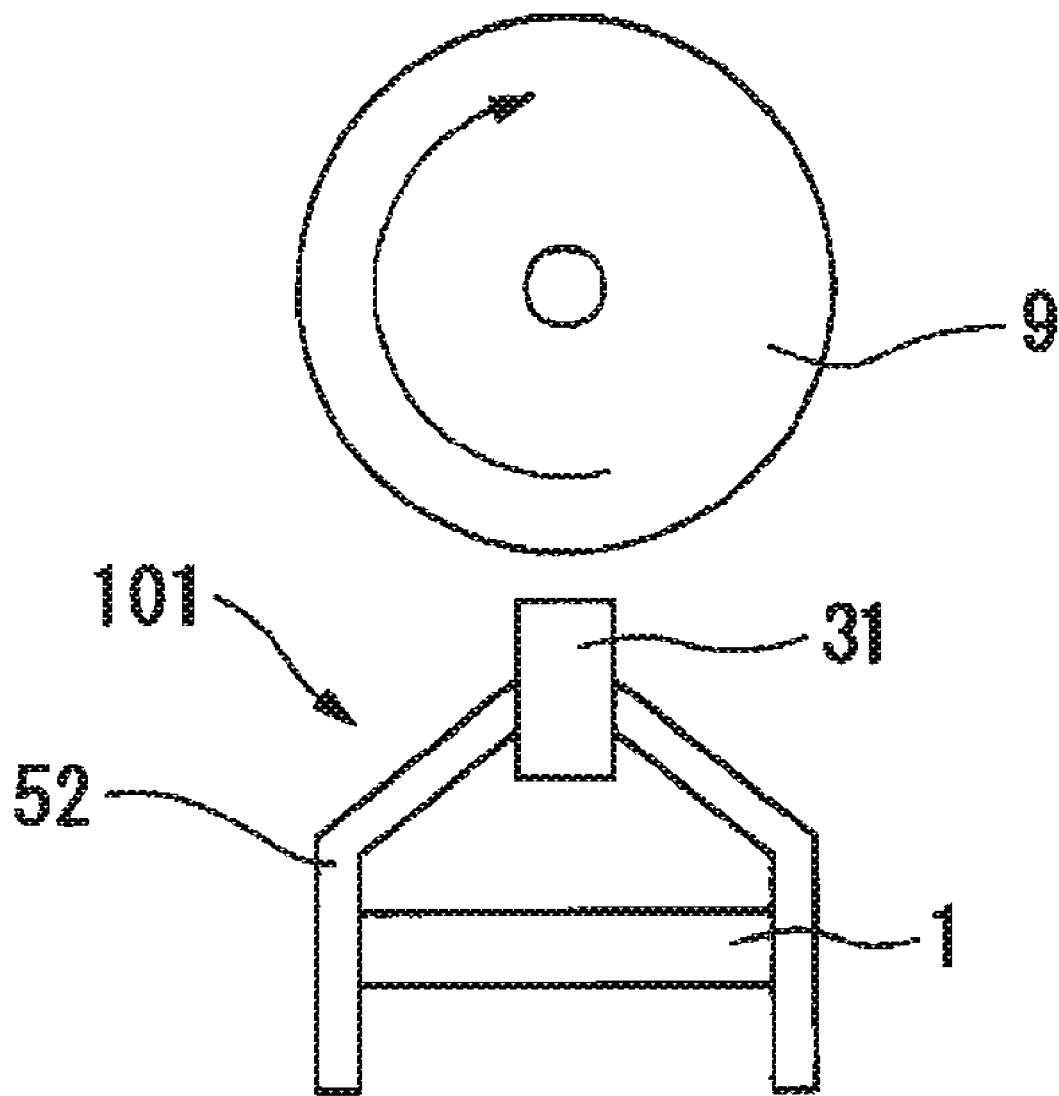
FIG. 11 is a schematic view for explaining a usage of a line head module.

FIG. 1 is a view showing a usage of the line head module 101 in a later-described image forming apparatus. As shown in FIG. 11, in the line head module 101, light is illuminated on a photosensitive drum 9, that s, a to-be-exposed object and an image is formed, so that the exposure is performed. As described above, since the line head 1 and the SL array 31 are integrally supported by the head case 52 in an aligned state, a sufficient advantage can be obtained by simply aligning the line head module 101 with the photosensitive drum 9 in terms of usage thereof.

Therefore, in comparison with a case where the line head 1 and the SL array 31 are separately prepared, the line head module 101 can be easily aligned with photosensitive drum 9, so that exposure irregularity caused from defective alignment can be securely prevented.

Now, an image forming apparatus including the line head 1 according to the invention is described.

Tandem Type Image Forming Apparatus

Figure 12:
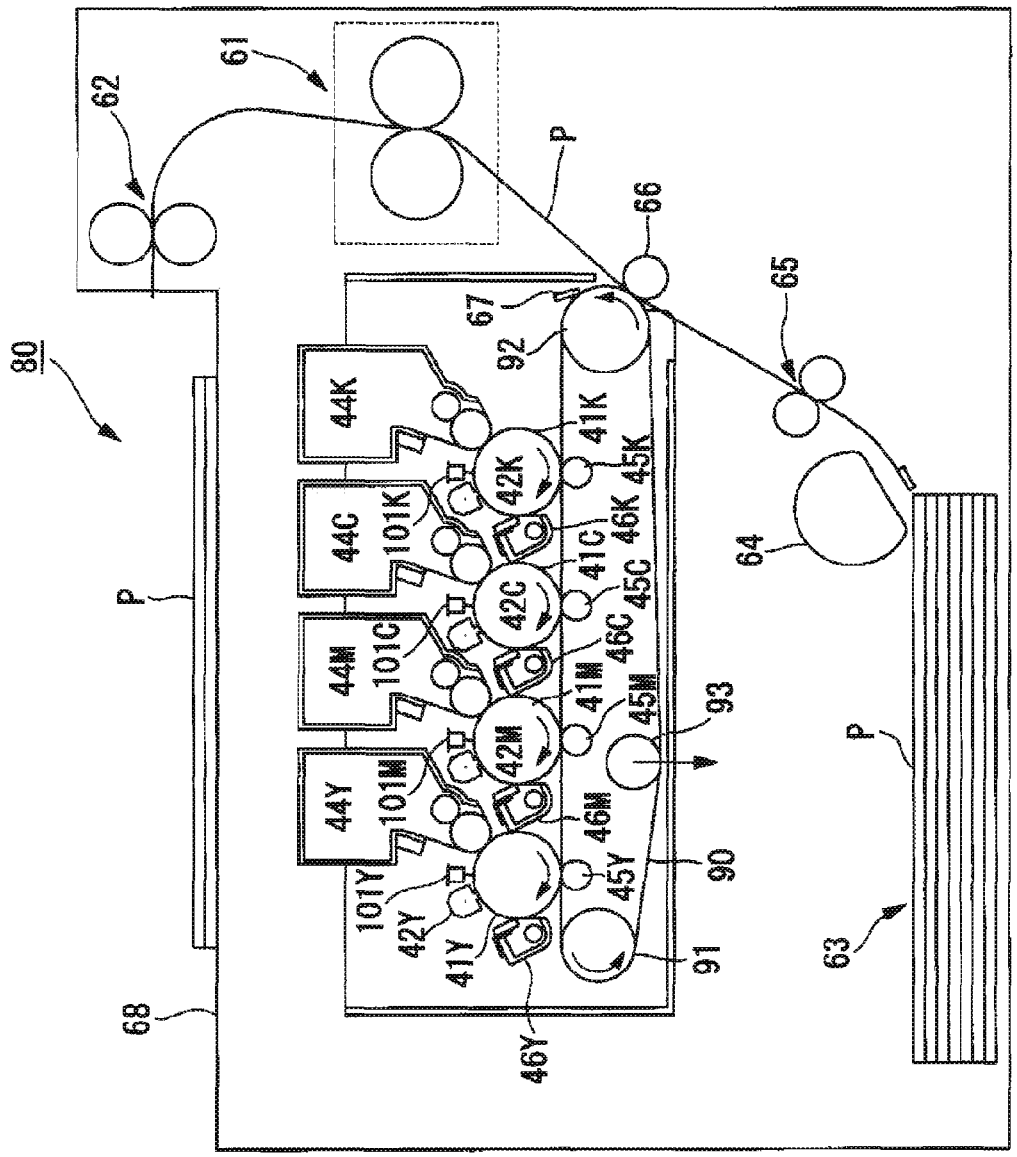
FIG. 12 is a schematic view showing a construction of an image forming apparatus according to a first embodiment of the invention.

FIG. 12 is a view showing an image forming apparatus according to a first embodiment of the invention. In FIG. 12, reference numeral 80 denotes a tandem type image forming apparatus. The image forming apparatus 80 is a tandem type image forming apparatus constructed with four organic EL array line head 101K, 101C, 101M, and 101Y as an example of the line head according to the invention which are used as exposure units for exposing four corresponding photosensitive drums (image containers) 41K, 41C, 41M, and 41Y having the same construction.

The image forming apparatus 80 includes a driving roller 91, a driven roller 92, and a tension roller 93. In addition, the image forming apparatus 80 also includes an intermediate transfer belt 90 which is arranged to extend by tension of the tension roller 93 and is driven to circulate in an arrow direction counterclockwise) shown in FIG. 12. On the intermediate transfer belt 90, the photosensitive drums 41K, 41C, 41M, and 41Y are disposed in a predetermined interval. The photosensitive drums 41K, 41C, 41M, and 41Y have photosensitive layers on outer circumferential surfaces thereof as image containers.

Here, K, C, M, and Y attached to the reference numerals are initials of black, cyan, magenta, and yellow and indicate black, cyant magenta, and yellow photosensitive bodies. The same notation is also used for other elements. The photosensitive drums 41K, 41C, 41M, and 41Y are driven to rotate in an arrow direction (clockwise) in FIG. 12 in synchronization with the driving of the intermediate transfer belt 90.

In the vicinity of the photosensitive drums 41 (K, C, M, and Y), there are disposed charging units (corona chargers) 42 (K, C, M, and Y) which uniformly charge the outer circumferential surfaces of the photosensitive drums 41 (K, C, M, and Y) and organic EL array line heads 101 (K, C, M, and Y) which sequentially line-scan the outer circumferential surfaces uniformed charged by the charging units 42 (K, C, M, and Y) in synchronization with the rotation of the photosensitive drums 41 (K, C, M, and Y).

Here, as described above, the organic EL array line heads 101 (K, C, M, Y) together with the SL array (not shown) are integrally supported by the head case in an aligned state and used as a line head module.

In addition, the image forming apparatus includes developing units 44 (K, C, M, and Y) which develop visible images (toner images) by applying toners (developing materials) on electrostatic latent images formed by the organic EL array line heads 101 (K, C, M, and Y), primary transfer rollers 45 (K, C, X, and Y which sequentially transfer the toner images developed by the developing units 44 (K, C, M, and Y) on the intermediate transfer belt 90, that is, primary transfer objects, and cleaning units 46 (K, C, M, and Y) which remove toners remaining on the surfaces of the transferred photosensitive drums 41 (K, C, M, and Y).

Here, the organic EL array line heads 101 (K, C, M, and Y) are disposed so as for the array direction to be aligned with a main line of the photosensitive drums 41 (K, C, M, and Y). Light-emitting energy peak wavelength of the organic EL array line heads 101 (K, C, M, and Y) and sensitivity peak wavelengths of the photosensitive drums 41 (K, C, M, and Y) are set to be substantially equal to each other.

The developing units 44 (K, C, M, and Y) use, for example, a single component non-magnetic toner as a developing material. The single component developing material is conveyed to a developing roller by, for example, a supplying roller. A thickness of a layer of the developing material attached on the surface of the developing roller is regulated by a regulating blade. Next, the developing roller is in contact with or pressed on the photosensitive drums 41 (K, C, M, and Y) to attach the developing material on the photosensitive drums 41 (K, C, M, and Y) according to electric potential levels thereof, thereby developing the toner images.

The toner images of black, cyan, magenta, and yellow formed by four monotonic toner image formation stations are primarily transferred onto the intermediate transfer belt 90 by a primary transfer bias applied to the primary transfer rollers 45 (K, C, M, and Y)and sequentially overlapped on the intermediate transfer belt 90 to form a full color toner image The full color toner image which is formed by sequentially overlapping on the intermediate transfer belt 90 is secondarily transferred onto a recording medium P such as a paper sheet by a secondary transfer roller 66 and, after that, passes through a fixing roller pair 61, that is, a fixing unit to be fixed on the recording medium P. The fixed toner image is discharged on a discharging tray 68 disposed at an upper portion of the image forming apparatus by a discharging roller 62.

In addition, in FIG. 12, reference numeral 63 denotes a feed cassette where a plurality of recording medium (P) sheets are stacked and held. Reference numerals 64 denotes a pickup roller which picks up and feeds the recording medium P sheet by sheet from the feed cassette 63. Reference numeral 65 denotes a gate roller pair which controls timings of supplying the recording medium P to the secondary transfer unit of the secondary transfer roller 66. Reference numeral 66 denotes the secondary transfer roller, that is, a secondary transfer unit for the intermediate transfer belt 90. Reference numeral 67 denotes a cleaning blade which removes toners remaining on the surface of the secondarily-transferred intermediate transfer belt 90.

Four-Cycle Type Image Forming Apparatus

Figure 13:
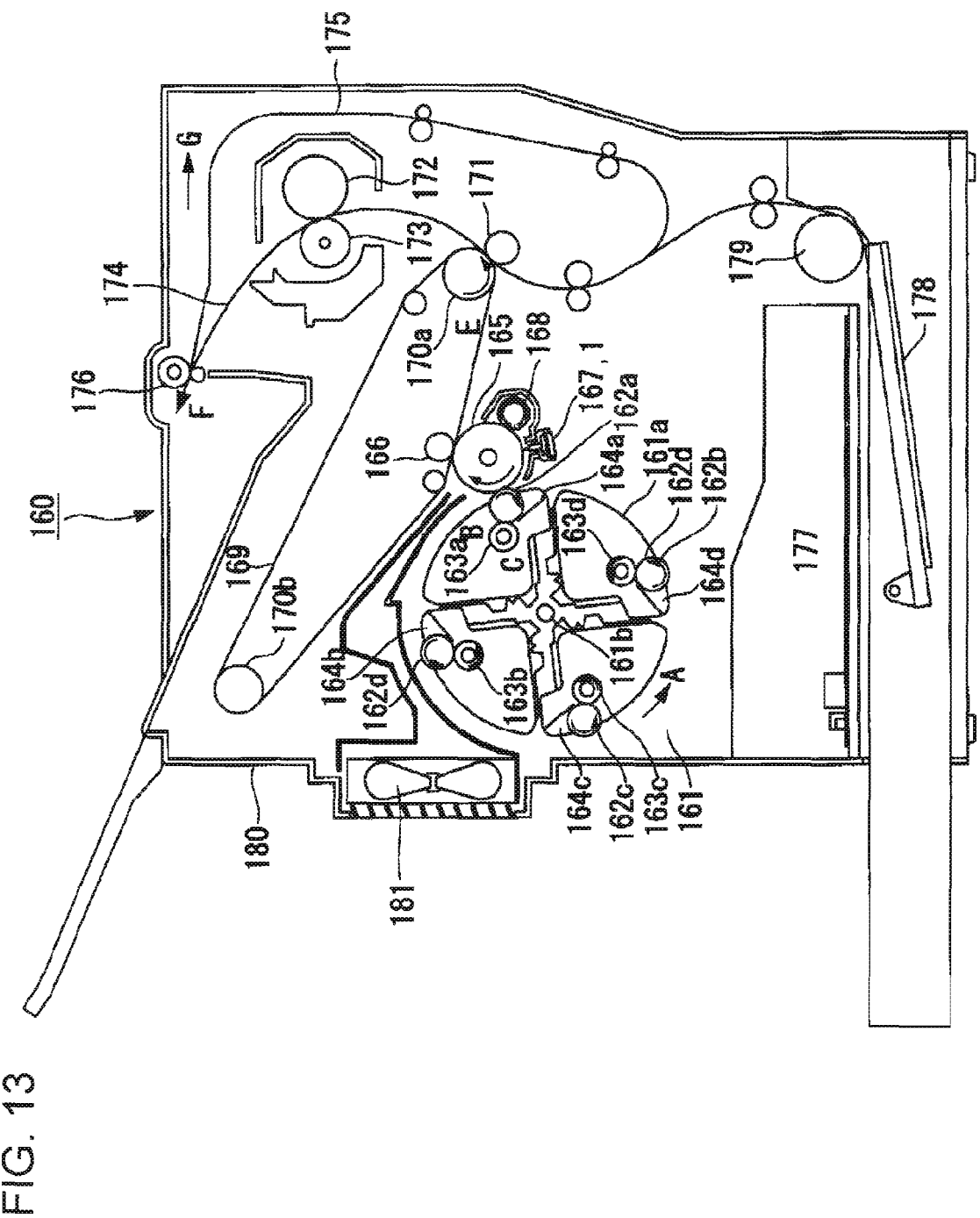
FIG. 13 is a schematic view showing a construction of an image forming apparatus according to a second embodiment of the invention.

Next, an image forming apparatus according to a second embodiment of the invention is described. FIG. 13 is a transverse side view showing a four-cycle type image forming apparatus. Referring to FIG. 13, the image forming apparatus 160 includes, as main components, a rotary type developing unit 161, a photosensitive drum 165 functioning as an image container, an image recording unit (exposure unit) 167 constructed with the aforementioned line head module, an intermediate transfer belt 169, a paper carrying path 174, a heating roller 172 for a fixing unit, and a feeding tray 178.

In the developing unit 161, a developing roller 161*a* is arranged to rotate about a shaft 161*b* in an arrow direction A. An inner portion of the developing rotary 161*a*are divided into four sections which are provided with four color image forming units for yellow Y, cyan C, magenta M, and black K. Reference numerals 162*a* to 162*d* denote developing rollers which are disposed on the four color image forming units and rotate in an arrow direction B. Reference numerals 163*a* to 163*d* denote toner supply rollers which rotate in an arrow direction C. Reference numerals 164*a* to 164*d* denote regulating blades which regulate the toner in a predetermined thickness thereof.

In FIG. 13, reference numeral 165 denotes a photosensitive drum 66 functioning as an image container as described above, and reference numeral 160 denotes a primary transfer member. Reference numeral 168 denotes a charger. Reference numeral 167 denotes an image recording unit, that is, the exposure unit according to the invention which is constructed with the aforementioned line head module. The photosensitive drum 165 is driven to rotate in an arrow direction D, that is, a reverse direction of the rotation of the developing roller 162*a* by a driving motor (not shown), for example, a step motor. The line head module constituting the image recording unit 167 is disposed in the state that position alignment (optical axis alignment) between the line head module and the photosensitive drum 165 is maintained.

The intermediate transfer belt 169 is arranged to extend by tension between the driving roller 170*a* and the driven roller 170*b*. The driving roller 170*a* is connected to the driving motor of the photosensitive drum 165 to transmit a power to the intermediate transfer belt 169. By the driving of the driving motor, the driving roller 170*a* of the intermediate transfer belt 169 is driven to rotate in an arrow direction E, that is, a reverse direction of the rotation of the photosensitive drum 165.

The paper carrying path 174 is provided with a plurality of pairs 176 of carrying rollers and paper discharging rollers so as to carry the paper. One-side image (toner image) contained on the intermediate transfer belt 169 is transferred on one side surface of the paper at a position of the secondary transfer roller 171. The secondary transfer roller 171 is separated from or in contact with the intermediate transfer belt 169 by a clutch. At the time of clutch ON, the secondary transfer roller 171 is in contacted with intermediate transfer belt 169, so that the image is transferred on the paper.

Next, the paper on which the image is transferred is subject to a fixing process in the fixing unit having a fixing heater H. The fixing unit includes a heating roller 172 and a pressing roller 173. After the fixing process, the paper is pulled toward the discharging roller pair 176 to proceed in an arrow direction F. In this state, the discharging roller pair 176 is driven to reversely rotate, so that the direction of the paper is reverted to proceed along the double side printing carrying path 175 in an arrow direction G. Reference numeral 177 denotes an electric component box. Reference numeral 178 denotes a feed tray which receives paper, and reference numeral 179 denotes a pickup roller which is disposed at an outlet of the feed tray 178.

In the paper carrying path, as a driving motor for driving the carrying roller, for example, a low speed brushless motor is used. In addition, in the intermediate transfer belt 169, since color difference needs to be corrected, a step motor is used. These motors are controlled based on signals from a control unit (not shown).

In the state shown in FIG. 13, an electrostatic latent image in yellow Y is formed on the photosensitive drum 165, and a high voltage is applied to the developing roller 162a, so that a yellow image is formed on the photosensitive drum 165. When both of rear and front side image in yellow are contained on the intermediate transfer belt 169, the developing rotary 161a is driven to rotate by 90 degrees in the arrow direction A.

The intermediate transfer belt 169 rotates in one cycle to return to the position of the photosensitive drum 165. Next, two-side image in cyan C is formed on the photosensitive drum 165, and the cyan image is contained on the intermediate transfer belt 169 to overlap the yellow image. After that, the developing rotary 161 rotates by 90degrees, and the image is contained on the intermediate transfer belt 169. After that, one rotation process repeats.

When the four color image is contained, the intermediate transfer belt 169 rotates four times, and the rotation position is controlled to transfer the image on the paper at the secondary transfer roller 171. The paper fed from the feed tray 178 is carried along the paper carrying path 174, and the color image is transferred on one-side surface of the paper at the position of the secondary transfer roller 171. The paper of which one-side surface is transferred with the image is inverted at the discharging roller pair 176 and stands by at the paper carrying path. After that, at a suitable Liming, the paper is carried to the position of the secondary transfer roller 171, and the color image is transferred on the other side surface. The housing 180 is provided with a discharging pan 181.

In the image forming apparatuses 80 and 160 shown in FIGS. 12 and 13, the line head module according to the invention shown in FIG. 1 is provided as the exposure unit.

Accordingly, in the image forming apparatuses 80 and 160, since the line head 1 which is constructed by effectively sealing the organic EL devices (light-emitting devices) 3 is used as the exposure unit, deterioration of the exposure unit caused from moisture or the like can be suppressed, so that it Ls possible to ensure a long-time reliability of the image forming apparatuses 80 and 160.

Electronic Apparatus

The light-emitting apparatus is not limited to the aforementioned line head 1, but it may be employed as an organic EL display apparatus having a general panel construction. Therefore, since such an organic EL display unit is used as a display unit, the invention may be employed by various electronic apparatuses.

Figure 14:
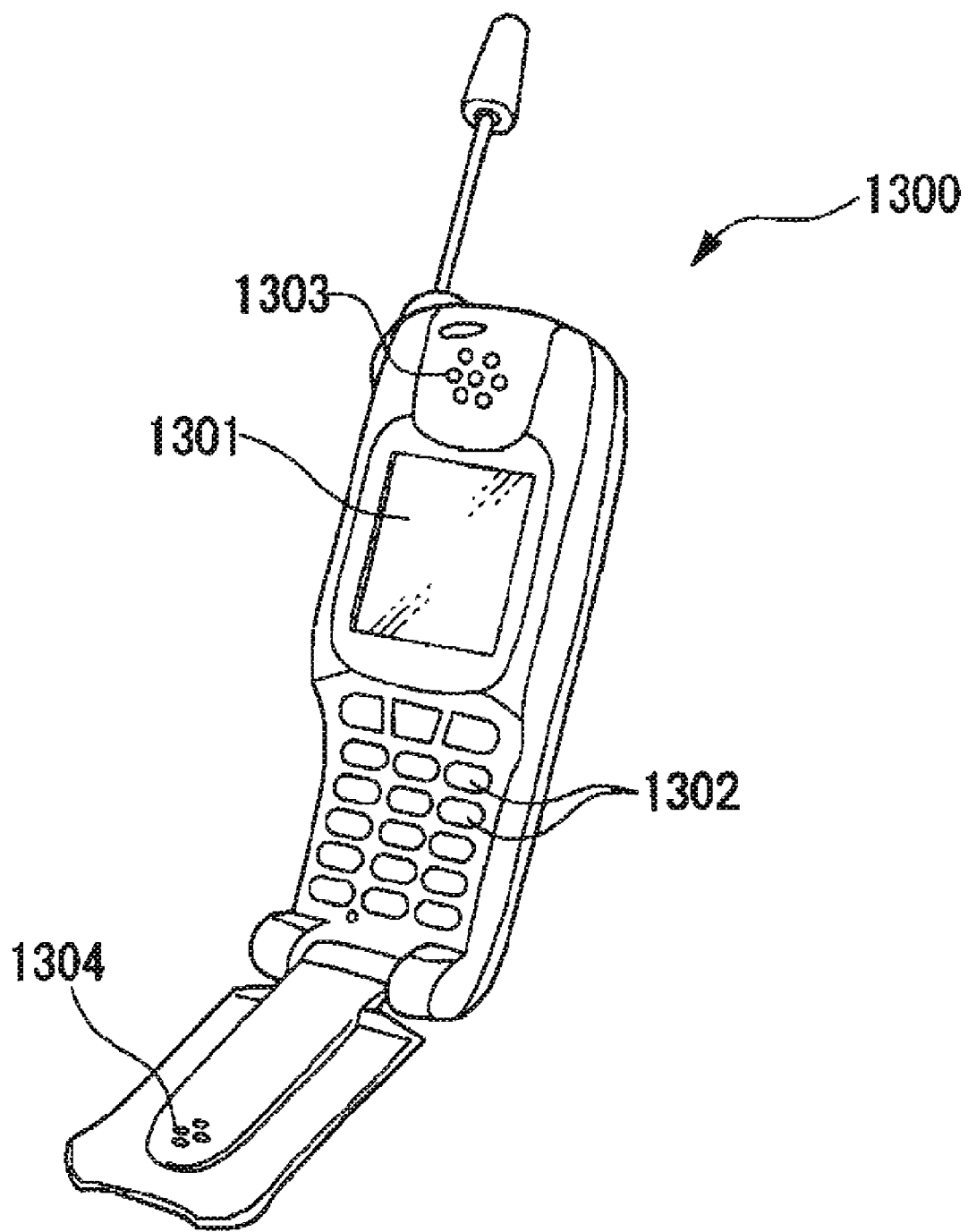
FIG. 14 is a perspective view showing an electronic apparatus according to an embodiment of the invention.

FIG. 14 is a perspective view showing an example of an electronic apparatus according to the invention. In the figure, a mobile phone 1300 includes the aforementioned light-emitting apparatus (organic EL display apparatus) as a display unit 1301, a plurality of manipulation buttons 1302, an earpiece 1303, and a mouthpiece 1304.

As an electronic apparatus, the invention is not limited to the mobile phone 1300. The invention may be employed in an electronic book, a personal computer, a digital still camera, a liquid crystal television set, a view finder type or monitor direct-view type video tape recorder, a car navigation system, a pager, an electronic scheduler, a calculator, a word processor, a workstation, a video telephone, a POS terminal, an apparatus having a touch panel, or the like.

What is claimed is:

1. A light-emitting apparatus comprising:
    a device substrate;
    a sealing substrate;
    a light-emitting device attached to the device substrate and configured between the device substrate and the sealing substrate;
    a first sealing material disposed between the device substrate and the sealing substrate, the first sealing material extending substantially around the light-emitting device except at a sealing hole portion;
    at least one guide portion disposed along the first sealing material, the at least one guide portion continuously disposed with at least one side of the sealing hole portion, the at least one guide portion extending to an inner surface of the device substrate; and
    a second sealing material disposed along the at least one guide portion and sealing the sealing hole portion, the second sealing material and the first sealing material forming a ring-shaped sealing member around the light-emitting device between the device substrate and the sealing substrate such that the inner surface of the device substrate is disposed within the ring-shaped member.

2. The light-emitting apparatus according to claim 1, wherein the at least one guide portion includes two guide portions continuously disposed on the device substrate on each side of the sealing hole portion.

3. The light-emitting apparatus according to claim 2, wherein the two guide portions are disposed apart from each other on the device substrate such that an interval is formed between the two guide portions, the interval enlarging from a side of the sealing hole portion to a position more distant from the inner surface of the device substrate.

4. The light-emitting apparatus according to claim 3, wherein the two guide portions are configured at an angle relative to one another, the angle being in the range of 5° to 170°.

5. The light-emitting apparatus according to claim 1, the first sealing material further including a width portion disposed near the sealing hole portion, a width of the width portion being wider than a width of the first sealing material disposed other than at the width portion.

6. The light-emitting apparatus according to claim 1, further including a sealing material extension portion, the sealing material extension portion having a concave-shape extending within the ring-shaped sealing member.

7. The light-emitting apparatus according to claim 1, wherein the sealing hole portion is disposed at side end portions of the device substrate and the sealing substrate.

8. An image forming apparatus having the light-emitting apparatus according to claim 1 as an exposure unit.

* * * * *